United States Patent
Lee et al.

(10) Patent No.: US 8,809,162 B2
(45) Date of Patent: Aug. 19, 2014

(54) METHOD FOR MANUFACTURING A SEMICONDUCTOR DEVICE COMPRISING A GUARD RING BETWEEN A CELL REGION AND A PERIPHERAL REGION

(75) Inventors: Dong Geun Lee, Seoul (KR); Sung Hyun Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 175 days.

(21) Appl. No.: 12/840,125

(22) Filed: Jul. 20, 2010

(65) Prior Publication Data
US 2011/0260286 A1  Oct. 27, 2011

(30) Foreign Application Priority Data
Apr. 22, 2010  (KR) .................. 10-2010-0037524

(51) Int. Cl.
| H01L 21/765 | (2006.01) |
| H01L 21/762 | (2006.01) |
| H01L 27/108 | (2006.01) |
| H01L 23/58 | (2006.01) |
| H01L 27/105 | (2006.01) |
| H01L 27/02 | (2006.01) |

(52) U.S. Cl.
CPC ........ *H01L 27/105* (2013.01); *H01L 21/76229* (2013.01); *H01L 27/10894* (2013.01); *H01L 23/585* (2013.01); *H01L 27/0207* (2013.01)
USPC .... 438/430; 257/409; 257/508; 257/E29.012; 257/E29.013

(58) Field of Classification Search
CPC . H01L 21/76; H01L 21/76229; H01L 23/585; H01L 29/0619
USPC .................. 257/409, 508, E29.012, E29.013; 438/430
See application file for complete search history.

(56) References Cited

U.S. PATENT DOCUMENTS

| 6,346,366 | B1 * | 2/2002 | Chu et al. ...................... 430/312 |
| 7,009,228 | B1 * | 3/2006 | Yu .................................. 257/256 |
| 2003/0132429 | A1 * | 7/2003 | Kim et al. ........................ 257/1 |
| 2005/0127473 | A1 * | 6/2005 | Sakagami ..................... 257/510 |
| 2009/0068814 | A1 * | 3/2009 | Cho et al. ...................... 438/386 |
| 2009/0090947 | A1 * | 4/2009 | Yoon et al. .................... 257/296 |

FOREIGN PATENT DOCUMENTS

| KR | 1020010065291 A | 7/2001 |
| KR | 1020040058762 A | 7/2004 |
| KR | 1020060104214 A | 10/2006 |

* cited by examiner

*Primary Examiner* — Tom Thomas
*Assistant Examiner* — Christopher M Roland

(57) ABSTRACT

A semiconductor device including a cell region and a peripheral region, the semiconductor device comprising: a guard ring region provided between the cell region and the peripheral region, the guard ring region having a barrier structure.

6 Claims, 11 Drawing Sheets

METHOD FOR MANUFACTURING A SEMICONDUCTOR DEVICE COMPRISING A GUARD RING BETWEEN A CELL REGION AND A PERIPHERAL REGION

CROSS-REFERENCE TO RELATED APPLICATION

The priority of Korean patent application No. 10-2010-0037524 filed on Apr. 22, 2010, the disclosure of which is hereby incorporated in its entirety by reference, is claimed.

BACKGROUND OF THE INVENTION

An embodiment of the present invention relates to a semiconductor device and a method for manufacturing the same.

Recently, as the data storage capacity of semiconductor memory devices has increased and the integration level has also increased, the size of each unit cell has been required to become smaller. As the integration of the semiconductor device becomes higher, a distance between a gate and a bit line connected to a cell transistor becomes closer. As a result, parasitic capacitance increases to a decrease in the operating reliability of the semiconductor device. In order to improve the reliability of the semiconductor device, a buried-type gate structure has been suggested. In the buried-type gate structure, a conductive material is formed in a recess formed in a semiconductor substrate, and the upper portion of the conductive material is covered with an insulating film so that a gate may be buried in the semiconductor substrate. As a result, electric separation between a bit line and a bit line contact plug formed on the semiconductor substrate is more clearly defined. A semiconductor device comprising of the buried-type gate and a method for manufacturing the same are described as follows.

FIG. 1 is a layout diagram illustrating a conventional semiconductor device.

Referring to FIG. 1, a semiconductor device includes a cell region I and a peripheral region II. In a cell region I, a device isolation structure 13 that defines an active region 15 is formed, and a plurality of gates 25 and a plurality of bit lines (not shown) are formed. The gate 25 is a buried gate, and a bit line contact plug 30 is formed on the active region 15 between the gates 25. The bit line (not shown) that contacts with the bit line contact plug 30 is formed perpendicular to the gate 25.

FIGS. 2a and 2b are cross-sectional diagrams illustrating the conventional semiconductor device and a method for manufacturing the same, which show cross-sectional views taken along a-a' of FIG. 1.

Referring to FIG. 2a, a semiconductor substrate 10 including the cell region I and the peripheral region II is etched to form a trench for device isolation that defines the active region 15. The trench (not shown) is filled with an oxide film to form the device isolation structure 13. One integrated device isolation structure 13 is formed in a boundary section between the cell region I and the peripheral region II. The device isolation structure 13 and the active region 15 of the cell region I are etched to form a recess. A gate oxide film (not shown) and a barrier metal layer (not shown) are formed on the resultant surface including the recess. The barrier metal layer (not shown) includes a titanium nitride (TiN) film. A conductive material 20 is buried in the lower portion of the recess having the barrier metal layer (not shown). The conductive material 20 includes tungsten. A first sealing nitride film 23 is formed on the resultant structure including the recess filled with the conductive material 20 to form a buried-type gate 25.

Referring to FIG. 2b, the first sealing nitride film 23 is etched to form a bit line contact hole, and the bit line contact hole is filled with a conductive material to form a bit line contact plug 30. A second sealing nitride film 35 is formed on the resultant structure including the bit line contact plug 30. A mask pattern (not shown) that opens the peripheral region II is formed on the upper portion of the second sealing nitride film 35. The first sealing nitride film 23 and the second sealing nitride film 35 of the peripheral region II are removed using the mask pattern as a mask.

A gate oxidation process for forming a gate is performed on the peripheral region II to form a gate oxide film 40. The mask pattern (not shown) is removed. A process for forming a bit line is performed on the cell region I, and a process for forming a gate is performed on the peripheral region II.

Since the gate oxidation process is performed on the peripheral region II after the buried-type gate 25 is formed in the cell region I, oxygen ions generated from the oxidation process may move along an oxidation path as shown by path 'A' in FIG. 2b. As a result, the TiN film which is a barrier metal layer (not shown) of the buried-type gate 25 is oxidized. The oxidation of the barrier metal layer causes a gate oxide integrity (GOI) fail and an unlimited sensing delay (USD) fail.

In order to prevent the GOI fail and the USD fail, an overlap between the buried-type gate and the peripheral circuit open mask of the cell region requires an overlap of at least 640 nm or more, and a distance between the gates of the peripheral region of the open mask requires a space of at least 740 nm or more. A distance between the buried-type gate of the cell region and the gate of the peripheral region requires a space of at least 1380 nm or more. However, as the minimum distance between the cell region and the peripheral region increases, the size of a die also increases, which results in a decrease in the number of dies per wafer, thereby reducing the cost efficiency.

BRIEF SUMMARY OF THE INVENTION

Various embodiments of the invention are directed to forming an active region that serves as a guard ring along a boundary part of a cell region and a peripheral region and forming a buried gate or a bit line contact in the active region so that the cell region may have a complete sealing structure, thereby improving characteristics of the semiconductor device.

According to an embodiment of the present invention, A semiconductor device including a cell region and a peripheral region, the semiconductor device comprising: a guard ring region provided between the cell region and the peripheral region, the guard ring region having a barrier structure.

The barrier structure has a shape of a buried-type gate. The barrier structure includes a conductive material and an insulating film provided within a trench defined in a guard ring region. The conductive material includes tungsten, a titanium nitride film and combinations thereof. The insulating film includes a nitride film.

The insulating film is formed on an upper portion of the guard ring region and the cell region. The barrier structure is a plug formed on the guard ring region. The plug has substantially the same dimension as a bit-line contact plug formed on the cell region. The plug includes one selected from the group consisting of a polysilicon layer, a metal layer and a combination thereof.

According to an embodiment of the present invention, A method for manufacturing a semiconductor memory device, the method comprising: providing a substrate having a cell region, a guard ring region, and a peripheral region, the guard ring region provided between the cell region and the peripheral region; etching a recess in the guard ring region to form a recess; filling conductive material into the recess; and depositing an insulating film within the recess over the conductive material in order to form a barrier structure in the guard ring region.

The conductive material includes one selected from the group consisting of tungsten, a titanium nitride film and a combination thereof. The insulating film includes a nitride film, and the insulating film is deposited over the peripheral region and the guard ring region while the insulating film is being deposited within the recess, the method further comprising: removing a portion of the insulating film overlying the peripheral region with a mask that exposes only the peripheral region.

The barrier structure is formed simultaneously with a gate in the cell region. The guard ring region encloses perimeters of the cell region.

According to an embodiment of the present invention, A method for manufacturing a semiconductor device, the method comprising: forming a guard ring region between a cell region and a peripheral region; depositing an insulating film over the cell region, guard ring region, and the peripheral region; etching the insulating film to form a contact hole to expose a portion of the guard ring region; depositing conductive material within the contact hole to form a contact plug; and removing the insulating film overlying the peripheral region to open the peripheral region, wherein the contact plug is formed at the same time a bit-line contact plug is being formed in the cell region.

The contact plug is a dummy contact plug and is configured to float 17. The insulating film includes a nitride film. The conductive material includes one selected from the group consisting of a polysilicon layer, a metal layer and a combination thereof. The contact plug is configured to prevent oxygen particles from migrating into the cell region. The insulating film is deposited when the buried-type gate is formed.

DESCRIPTION OF EMBODIMENTS

The present invention will be described in detail with reference to the attached drawings.

Figure 1:
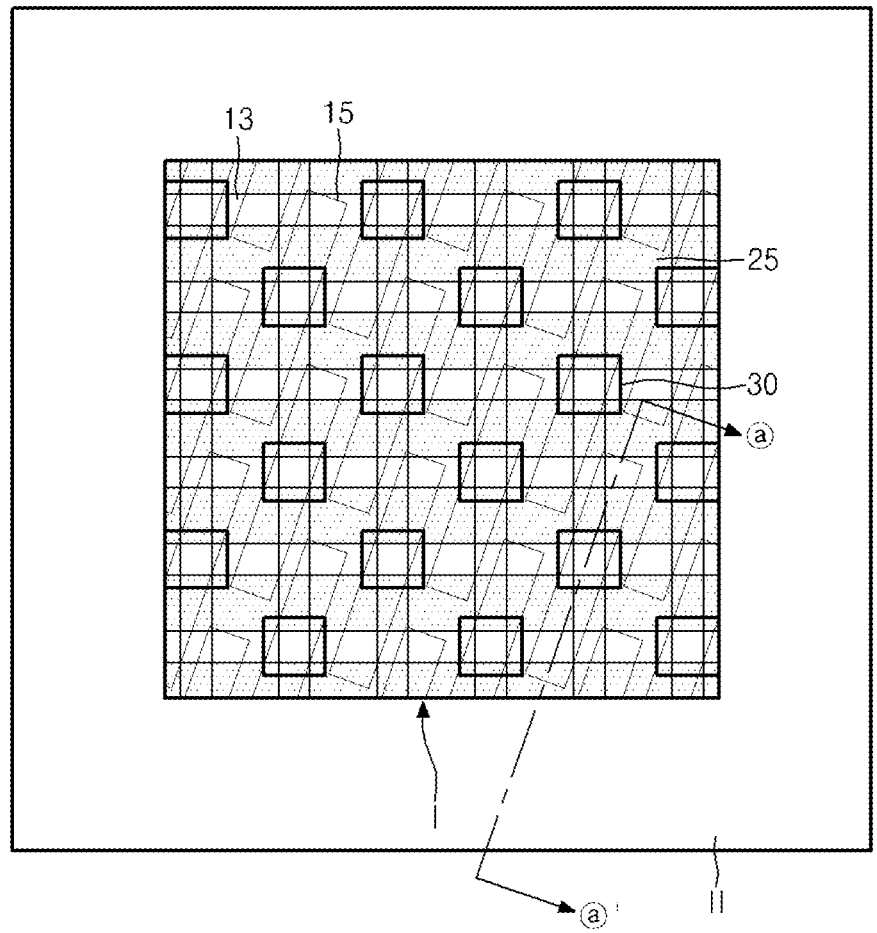
FIG. 1 is a layout diagram illustrating a conventional semiconductor device.
Figure 2A:
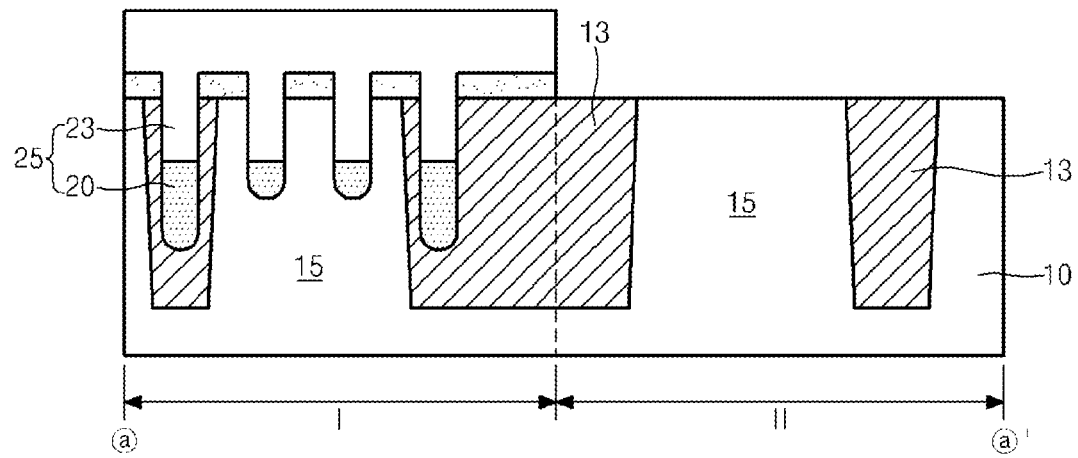
FIGS. 2a and 2b are cross-sectional diagrams illustrating the conventional semiconductor device.
Figure 2B:
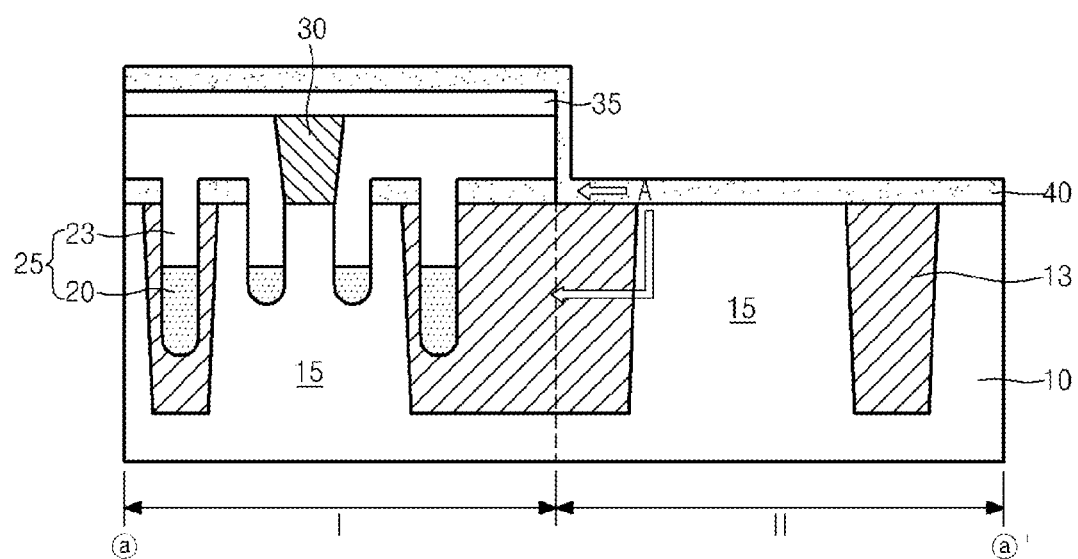
Figure 3:
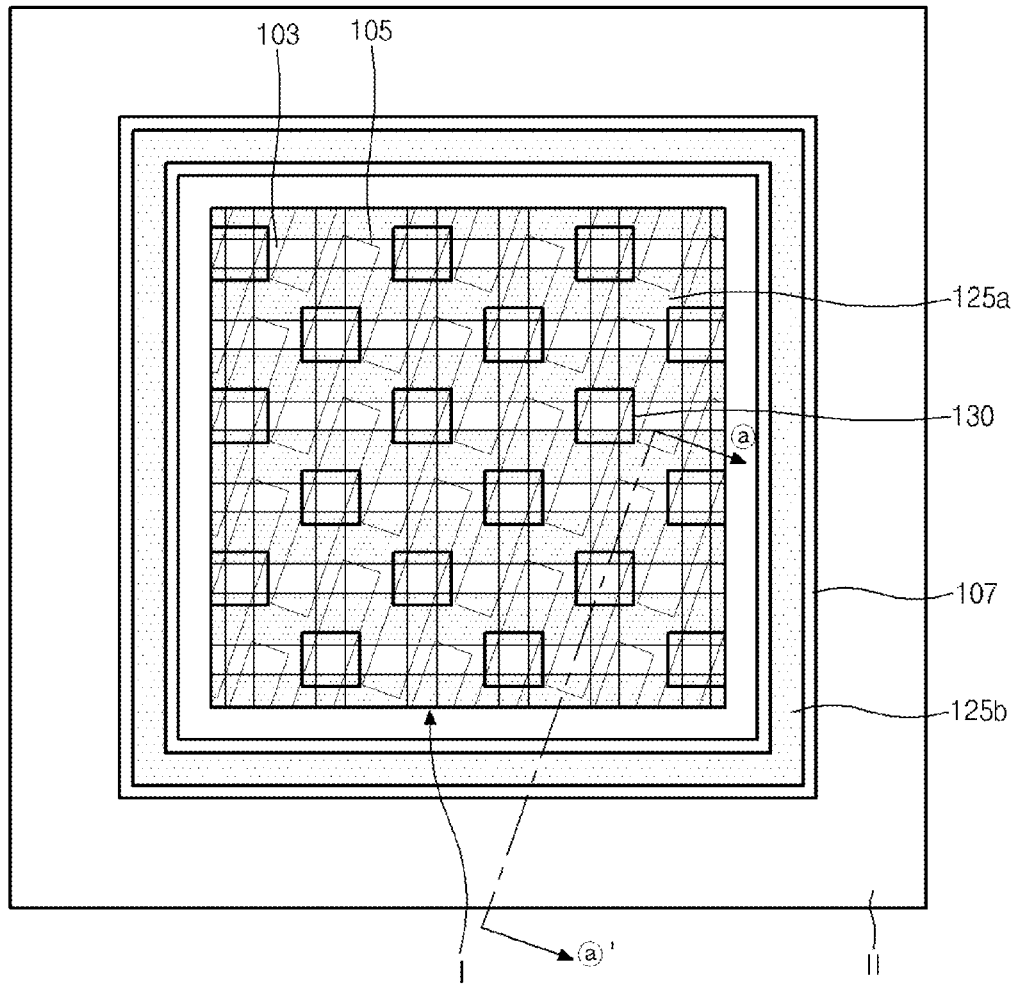
FIG. 3 is a layout diagram illustrating a semiconductor device according to an embodiment of the present invention.

FIG. 3 is a layout diagram illustrating a semiconductor device according to an embodiment of the present invention.

Referring to FIG. 3, a semiconductor device includes a cell region I and a peripheral region II. In the cell region I, a device isolation structure 103 that defines a first active region 105 is formed, and a plurality of first gates 125a are formed in the first active region 105. The first gate 125a may be a buried-type gate, but is not limited thereto. In the first active region 105, two first gates 125a can be formed. A bit line contact plug 130 is formed on the first active region 105 between the first gates 125a. A bit line (not shown) that contacts the bit line contact plug 130 is formed perpendicular to the first gate 125a.

A second active region 107 that serves as a guard ring is formed between the cell region I and the peripheral region II. In the second active region (or a guard ring region) 107, a second gate 125b is formed. The second gate 125b may be a buried-type gate having substantially the same structure as that of the first gate 125a. In an embodiment of the present invention, the second gate 125b not included in the active region 107, but a bit line contact plug is included in the upper portion of the active region 107. The second gate 125b in the second active region 107 serves as a guard ring structure to prevent oxygen ions from permeating from the peripheral region II into the cell region I.

FIGS. 4a to 4h are cross-sectional diagrams illustrating a method for manufacturing a semiconductor device according to an embodiment of the present invention, which show cross-sectional views taken along a-a' of FIG. 3.

Figure 4A:
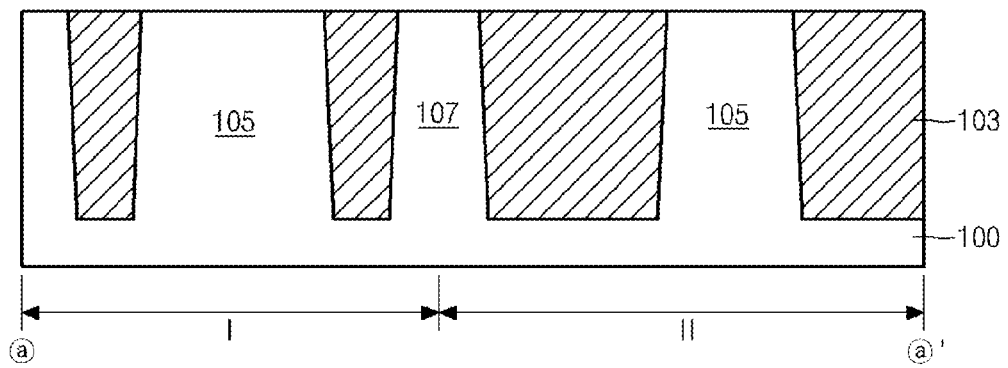
FIGS. 4a to 4h are cross-sectional diagrams illustrating a method for manufacturing a semiconductor device according to an embodiment of the present invention.

Referring to FIG. 4a, a semiconductor substrate 100 including the cell region I and the peripheral region II is etched to form a first trench for device isolation. After the first trench is filled with an oxide film, a planarizing process is performed to form a device isolation structure 103. The device isolation structure 103 defines the first active region 105 in the cell region I, the second active region 107 at the border of the cell region I and the peripheral region II, and a third active region 105 in the peripheral region II. The second active region 107 is formed between the first active region 105 in the cell region I and the third active region 105 in the peripheral region II.

Unlike a conventional art where the cell region I and the peripheral region II are in direct contact with each other, the cell region I and the peripheral region II are separated from each other by the second active region 107.

Figure 4B:
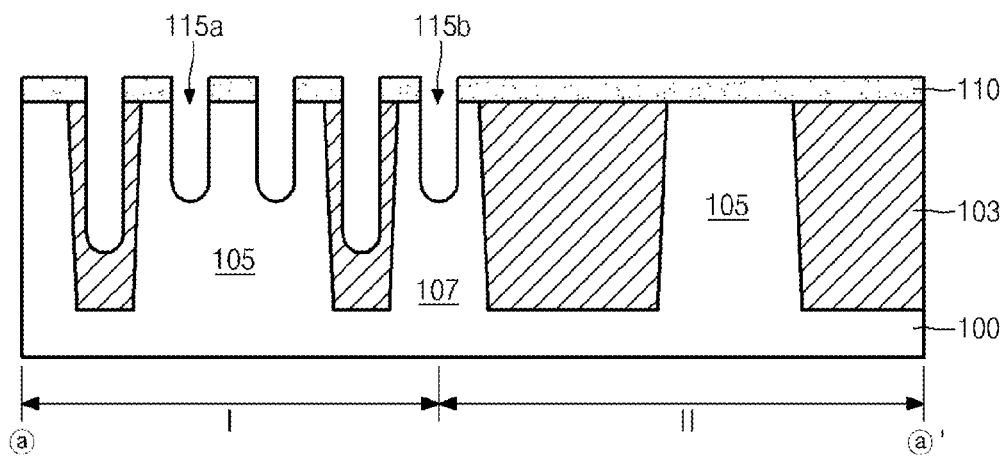

Referring to FIG. 4b, an oxide pattern 110 that defines a gate region is formed on the upper portion of the semiconductor substrate 100 including the device isolation structure 103. The gate region is also defined on the upper portion of the active region 107 formed between the cell region I and the peripheral region II. A device isolation structure 103 in the cell region I, the first active region 105 in the cell region I and the second active region 107 are etched using the oxide pattern 110 as a mask to form a first recess 115a in the first active region 105 and the device isolation structure 103 in the cell region I and a second recess 115b in the second active region 107. The depth of the first and the second recesses 115a and 115b is made different by an etching selectivity difference between the device isolation structure 103 including an oxide film and the first and the second active regions 105, 107 including a silicon material.

Figure 4C:
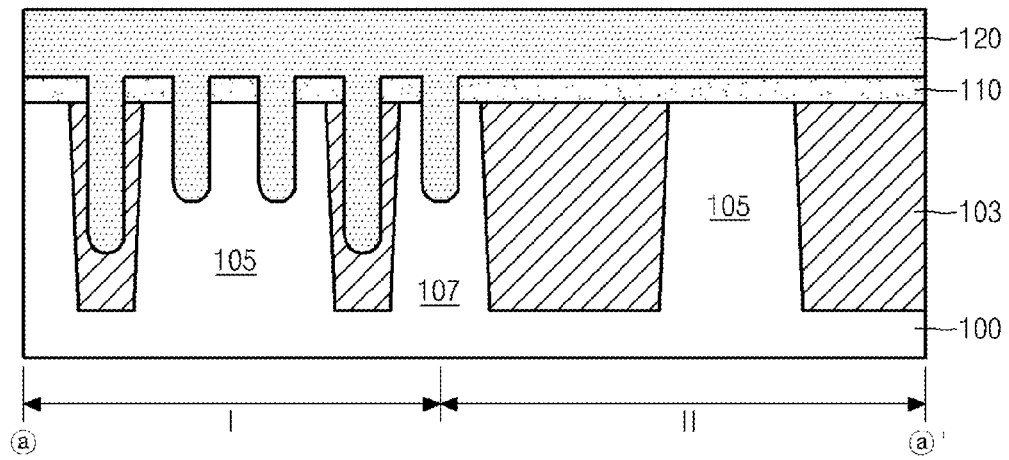

Referring to FIG. 4c, a gate oxidation process is performed onto the cell region Ito form a gate oxide film over the first recess 115a and 115b in the second active region 107. A barrier metal layer (not shown) is formed on the oxide pattern 110 including the recesses 115a and 115b. The barrier metal layer (not shown) can include a TiN film and can have a thickness ranging from about 50 to about 70 Å. A conductive material 120 is formed on the upper portion of the oxide pattern 110 including the recesses 115a and 115b. The conductive material 120 may be formed of tungsten, a TiN film or a combination thereof. The conductive material 120 may include tungsten W, which is formed to have a thickness ranging from about 1400 to about 1600 Å by a chemical vapor deposition (CVD) method.

Figure 4D:
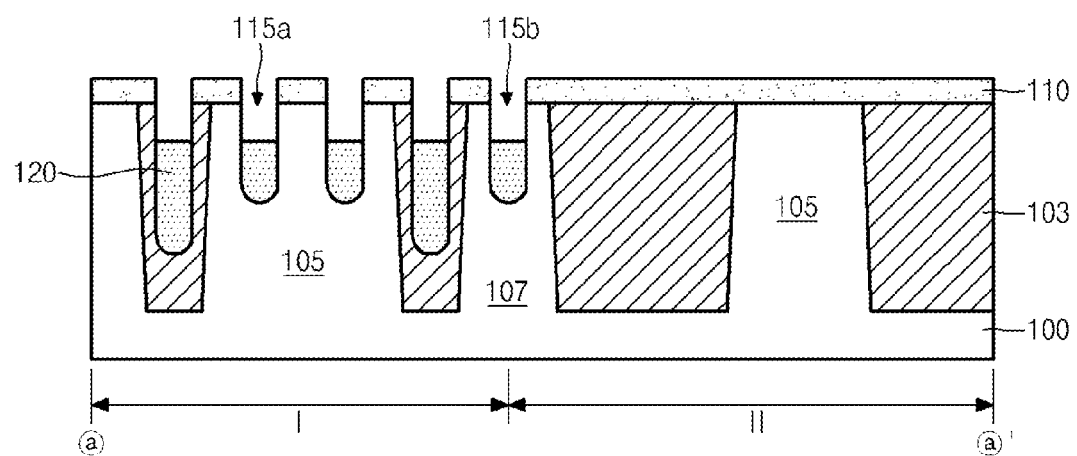

Referring to FIG. 4d, a chemical mechanical polishing (CMP) process is performed to expose the oxide pattern 110, thereby planarizing the conductive material 120. The upper portion of the oxide pattern 110 can be partially removed by the CMP process. The conductive material 120 is further etched by an etch-back process, so that the conductive material 120 has a shape having a given depth removed from the top side of the first and the second recesses 115a and 115b. The conductive material 120 has a thickness ranging from about 600 to about 800 Å which remains at the bottom part of the first and second recesses 115a and 115b.

Figure 4E:
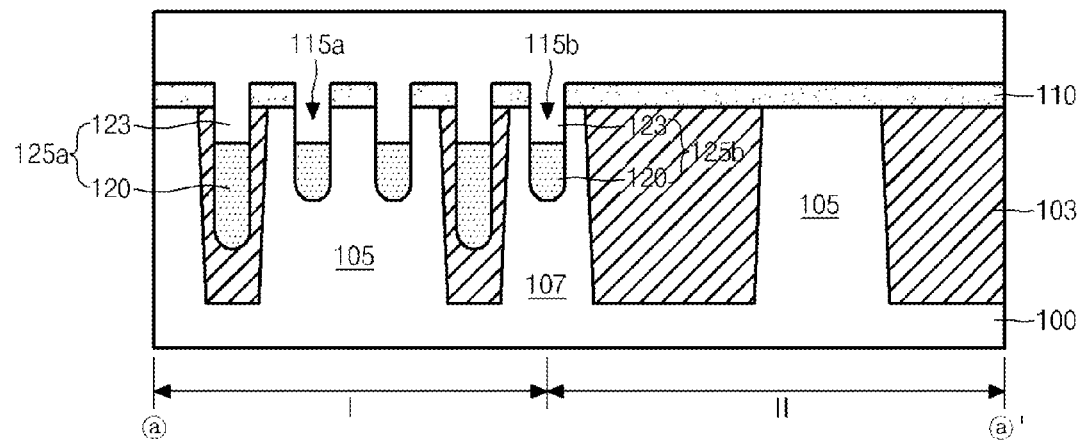
Figure 4F:
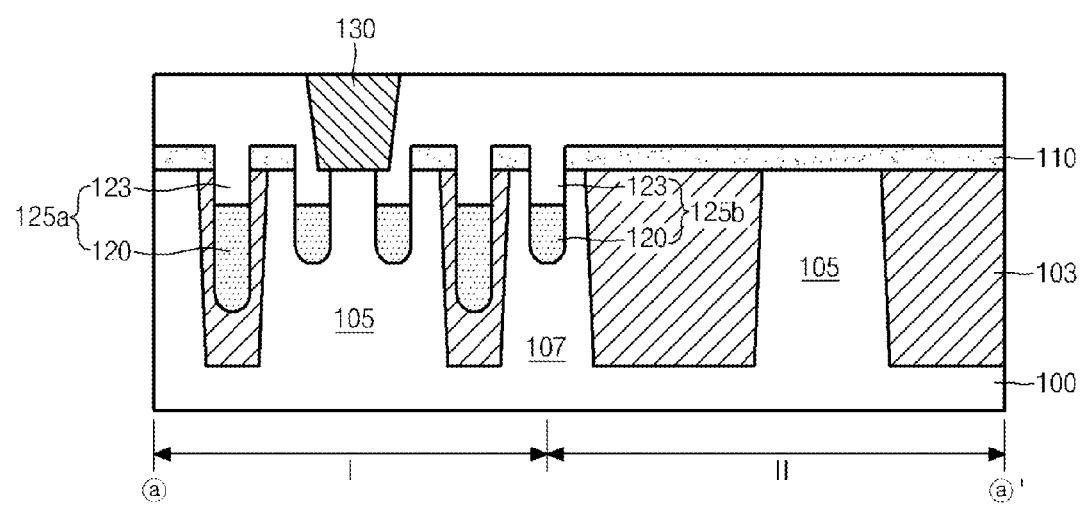

Referring to FIGS. 4e and 4f, a first sealing nitride film 123 is deposited on the upper portion of the semiconductor substrate 100 including the first and the second recesses 115a and 115b which are partially filled with the conductive material 120, thereby forming a first buried-type gate 125a in the cell region I and a second buried-type gate 125b in the second active region 107. The second buried-type gate 125b is a dummy gate used as a barrier structure to prevent impurities or undesirable particles (e.g., oxygen ions) from permeating into the cell region I from the peripheral region II. The first sealing nitride film 123 is formed to fill the first and the second recesses 115a and 115b. The first sealing nitride film 123 has a thickness ranging from about 600 to about 800 Å. The second buried-type gate 125b formed in the second active region 107 may be formed with substantially the same width as that of the first buried-type gate 125a formed in the cell region I. The width can be adjusted depending on a process margin for the peripheral region II.

A mask pattern (not shown) that defines a bit line contact region is formed on the upper portion of the first sealing nitride film 123. The mask pattern (not shown) can be formed of carbon, a silicon oxide nitride (SiON) film or a combination thereof. The first sealing film 123 is etched using the mask pattern (not shown) to form a bit line contact hole. The mask pattern (not shown) is also removed at this time. The bit line contact hole is formed to expose the semiconductor substrate 100 at one side of the first gate 125a formed in the first active region 105. Material such as a polysilicon layer, a metal layer or a combination thereof is formed on the resultant surface including the bit line contact hole. An etch-back process is performed to form a bit line contact plug 130 filling up the bit line contact hole.

Figure 4G:
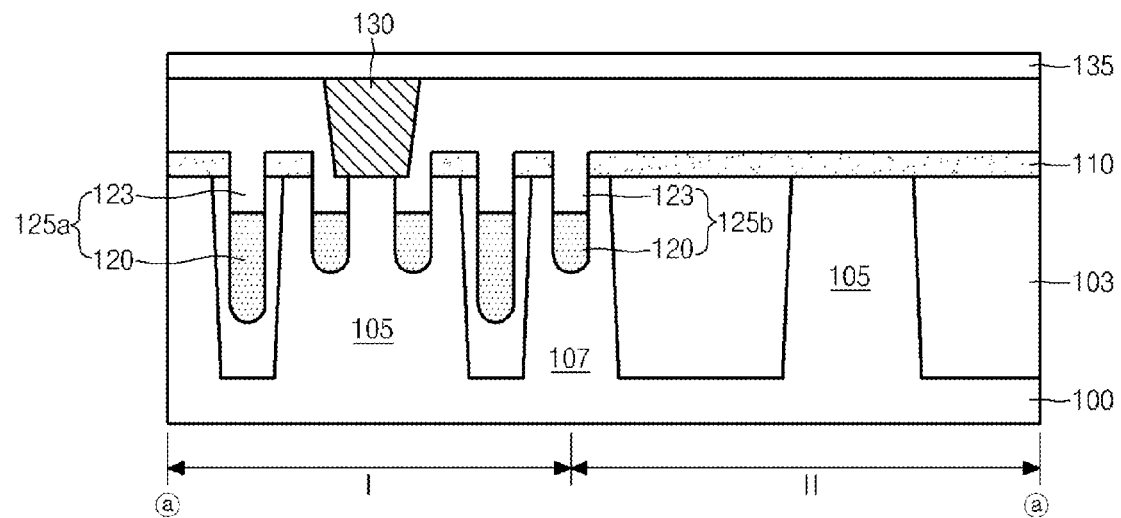
Figure 4H:
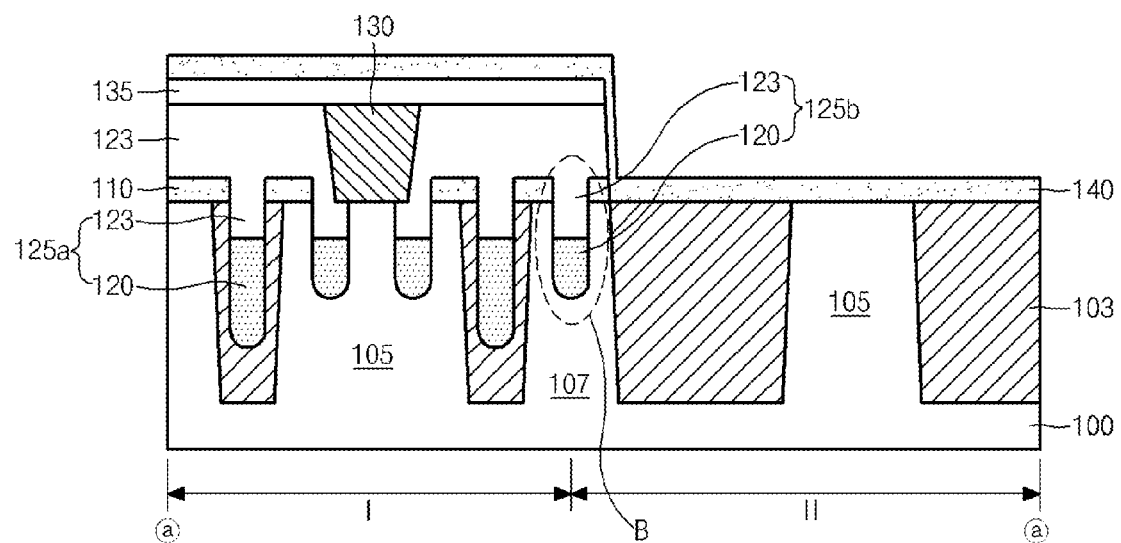

Referring to FIG. 4g, a second sealing nitride film 135 is deposited on the first sealing nitride film 123 including the bit line contact plug 130. The second sealing nitride film 135 is deposited at a thickness ranging from about 100 to about 300 Å. Referring to FIG. 4g, a mask pattern (not shown) that opens the peripheral region II is formed on the upper portion of the second sealing nitride film 135. The oxide pattern 110, the first sealing nitride film 123 and the second sealing nitride film 135 formed in the peripheral region II are etched away using the mask pattern (not shown).

The mask pattern (not shown) which opens the peripheral region II is formed to overlap a portion of the second buried-type gate 125b formed in the second active region 107 so that the second buried-type gate 125b will not be fully exposed.

A gate oxidation process is performed to form a gate oxide film 140 over the semiconductor substrate 100 in the peripheral region II. The gate oxidation process is performed to form a third gate(not shown) in the peripheral region II.

As mentioned above, the second active region 107 is formed between the cell region I and the peripheral region II. The second buried-type gate 125b is formed in the active region 107 to separate the cell region I from the peripheral region II (see 'B' of FIG. 4h). In a gate oxidation process for forming the gate oxide film 140 in the peripheral region II, the second buried-type gate 125b prevents oxygen ions from permeating into the cell region I and thus prevents oxidation of the TiN film. The TiN film is formed as a barrier metal layer (not shown) of the first buried-type gate 125a formed in the cell region I. That is, an oxidation path in the substrate 100 from the peripheral region II into the cell region I is blocked by the active region 107 and the second buried-type gate 125b, thereby preventing degradation of the cell region I performance.

FIGS. 5a to 5h are cross-sectional diagrams illustrating a method for manufacturing a semiconductor device according to another embodiment of the present invention, which shows cross-sectional views taken along a-a' of FIG. 3.

Figure 5A:
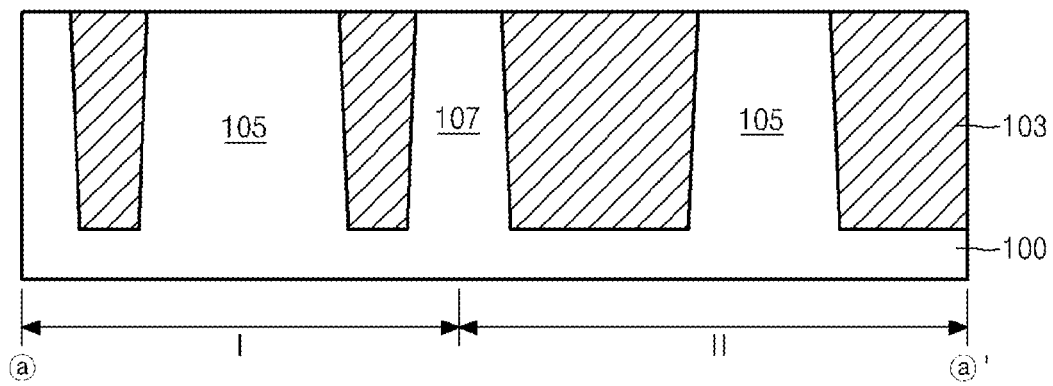
FIGS. 5a to 5h are cross-sectional diagrams illustrating a method for manufacturing a semiconductor device according to another embodiment of the present invention.

Referring to FIG. 5a, the semiconductor substrate 100 of a cell region I and a peripheral region II is etched to form a trench for device isolation that defines a first active region 105 in the cell region I, a second active region 107 between the cell region I and the peripheral region II, and a third active region 105 in the peripheral region II. After the trench (not shown) is filled with an oxide film, a planarization process is performed to form the device isolation structure 103. The second active region 107 for separating the cell region I from the peripheral region II is formed at the border of the cell region I and the peripheral region II.

Figure 5B:
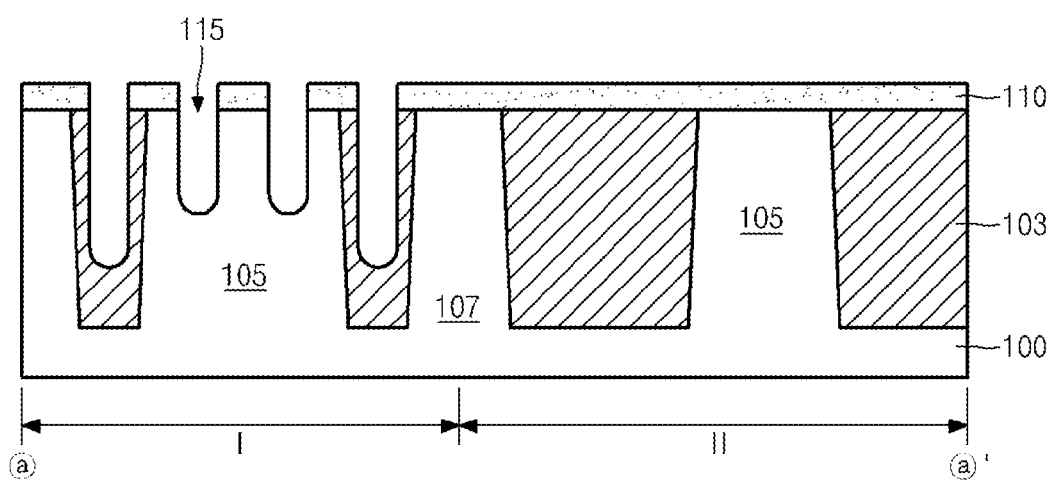

Referring to FIG. 5b, the oxide pattern 110 that defines a gate region is formed on the upper portion of the semiconductor substrate 100 including the device isolation structure 103. The gate region is defined in the cell region I but not in the second active region 107 or in the peripheral region II. The device isolation structure 103 and the active region 105 in the cell region I are etched using the oxide pattern 110 as a mask to form a first recess 115.

Figure 5C:
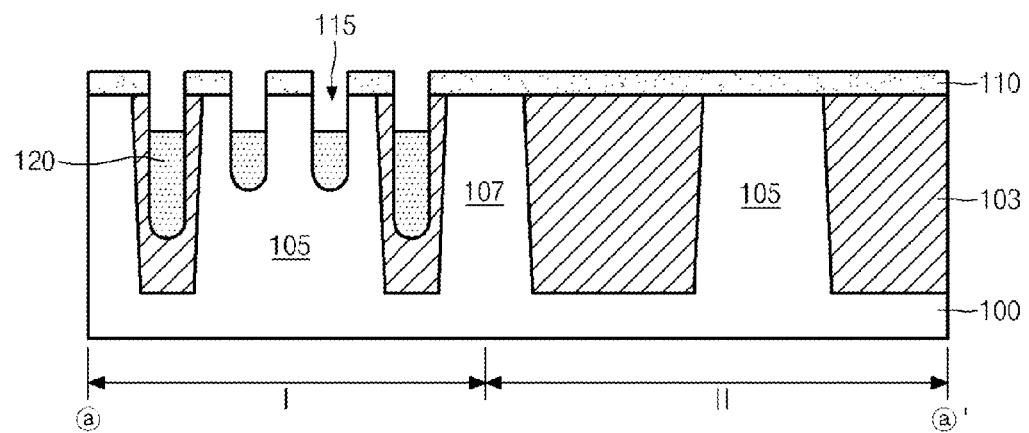

Referring to FIG. 5c, the gate oxidation process is performed on the cell region I to form a gate oxide film (not shown) in the first recess 115. A barrier metal layer (not shown) is formed on the surface of the oxide pattern 110 including the recess 115. The barrier metal layer (not shown) can be formed of a TiN film and have a thickness ranging from about 50 to about 70 Å. The conductive material 120 is formed over the oxide pattern 110 including the first recess 115. The conductive material 120 can be selected from tungsten, a TiN film and a combination thereof. For example, the conductive material 120 may be formed of tungsten W which is formed by a CVD method with a thickness ranging from about 1400 to about 1600 Å.

After a CMP process is performed to expose the oxide pattern 110, the conductive material 120 is further etched by an etch-back process so that the conductive material fills the lower portion of the first recess 115. The conductive material 120 remains to have a thickness ranging from about 600 to about 800 Å from the lower portion of the first recess 115.

Figure 5D:
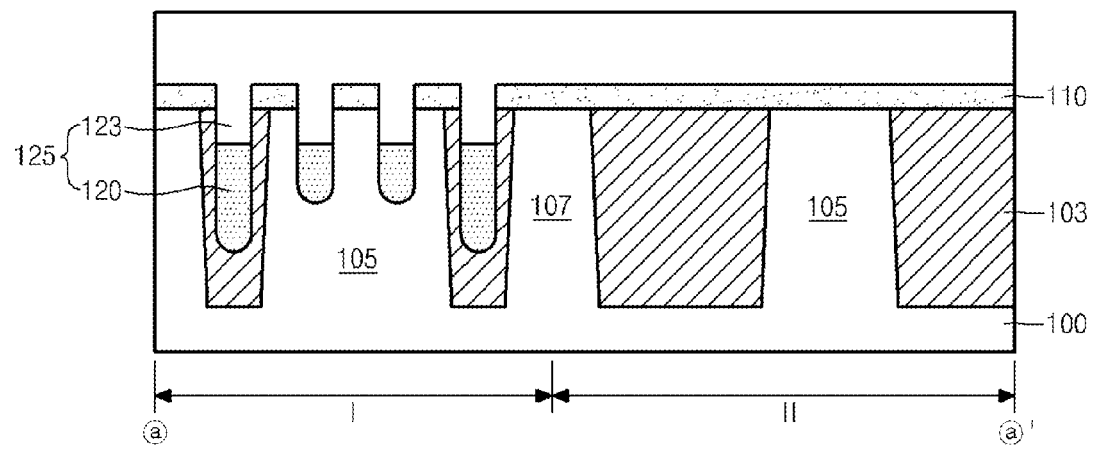
Figure 5E:
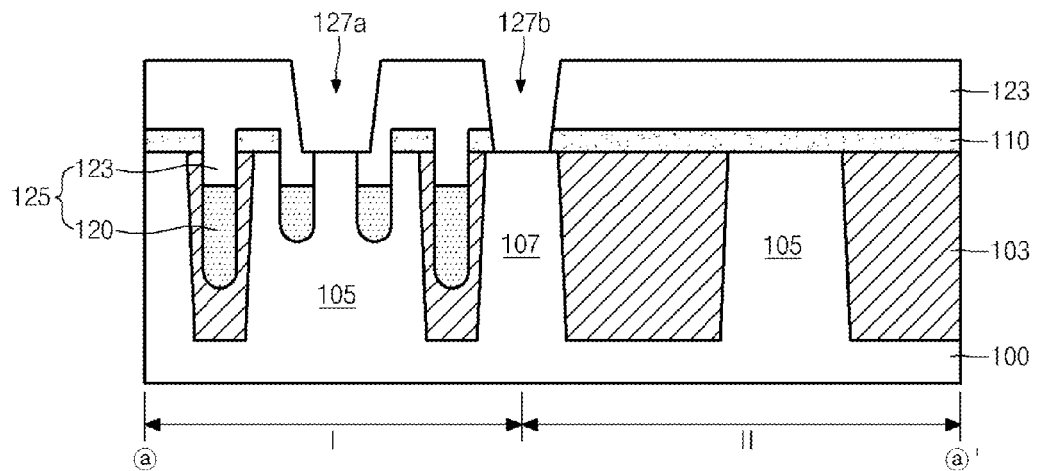

Referring to FIG. 5d, a first sealing nitride film 123 is formed on the upper portion of the semiconductor substrate 100 including the first recess 115. The first sealing nitride film 123 is formed to fill the upper portion of the first recess 115 to form a buried-type gate 125. The first sealing nitride film 123 has a thickness ranging from about 600 to about 800 Å. Referring to FIG. 5e, a mask pattern (not shown) that defines a bit line contact region is formed on the upper portion of the first sealing nitride film 123. The mask pattern (not shown) can be formed of carbon, a SiON film or a combination thereof.

The first sealing nitride film 123 is etched to form a first bit line contact hole 127a in the first active region 105 and then the mask pattern (not shown) is removed. The bit line contact hole 127a is formed to expose the semiconductor substrate 100 at one side of the gate 125 in the first active region 105. A second bit line contact hole 127b is also formed in the second active region 107 formed between the cell region I and the peripheral region II.

Figure 5F:
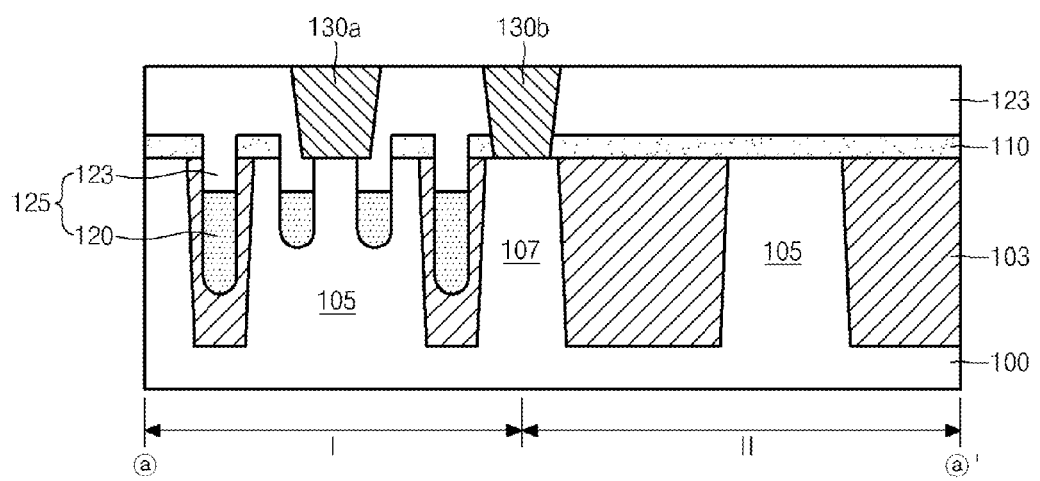

Referring to FIG. 5f, a layer such as a polysilicon layer, a metal layer and a combination thereof is formed on the upper portion of the first sealing nitride film 123 including the first and the second bit line contact holes 127a and 127b. An etch-back process is performed to form a first and a second bit line contact plug 130a and 130b. The width of the second bit line contact plug 130b formed in the second active region 107 may be formed to be identical to the first bit line contact plug 130a formed in the first active region 105 of the cell region I. However, the width may be adjusted depending on a process margin of the adjacent peripheral region II. The second bit line contact plug 130b formed in the second active region 107 blocks a path through which oxygen can permeate from the peripheral region II into the cell region I in a subsequent oxidation process. In the present embodiment, the second bit line contact plug 130b is a dummy bit-line contact plug that serves as a barrier structure to prevent oxygen ions or particles from migrating into the cell region I from the peripheral region II.

Figure 5G:
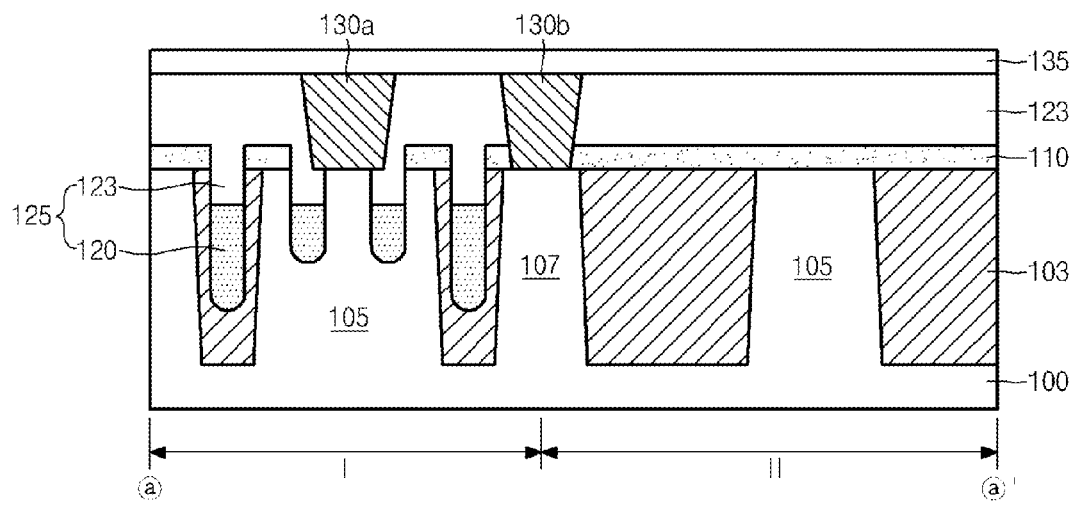
Figure 5H:
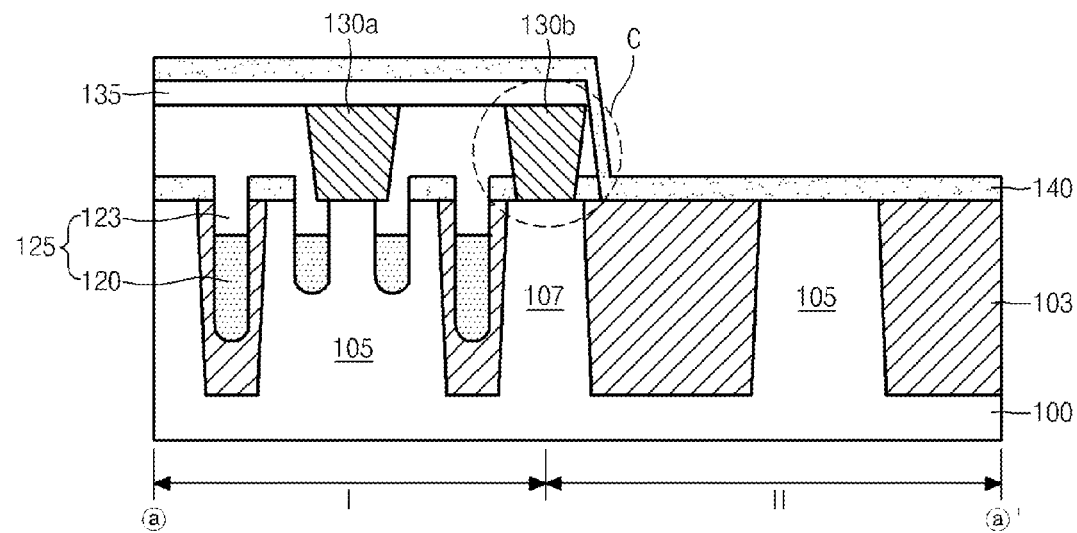

Referring to FIGS. 5g and 5h, a second sealing nitride film 135 is deposited on the upper portion of the first sealing nitride film 123 including the first and second bit line contact plugs 130a and 130b. A mask pattern (not shown) which opens the peripheral region II is formed on the upper portion of the second sealing nitride film 135. The oxide pattern 110, the first sealing nitride film 123 and the second sealing nitride film 135 of the peripheral region II are patterned using the mask pattern (not shown) as a barrier. The mask pattern (not shown) that opens the peripheral region II is formed to overlap a portion the bit line contact plug 130b formed on the guard ring active region 107 so that the bit line contact plug 130b formed on the guard ring active region 107 may not be exposed. However, a portion of the bit line contact plug 130b may be exposed but the whole bit line contact plug 130b may not be exposed.

A gate oxidation process is performed to form a gate oxide film 140 on the second sealing nitride film 135 of the cell region I and on the surface of the semiconductor substrate 100 of the peripheral region II. The gate oxidation process is performed to form a gate of the peripheral region II.

The second active region 107 is formed between the cell region I and the peripheral region II. The second bit line contact plug 130b is formed in the second active region 107 (see 'C' of FIG. 5h). In the gate oxidation process for forming the gate oxide film 140 in the peripheral region II, an oxidation path from the peripheral region II into the cell region I is blocked and thus the TiN film serving as a barrier metal layer (not shown) and forming of the buried-type gate 125 of the cell region I can be protected from undesired oxidation. That is, the oxidation path in the lower portion of the semiconductor substrate 100 can be blocked by the second active region 107, and the oxidation path in the upper portion of the semiconductor substrate 100 can be blocked by the second bit line contact plug 130b.

As described above, a semiconductor device and a method for manufacturing the same according to an embodiment of the present invention may prevent oxidation of a buried-type gate formed in a cell region and also prevent GOI fail and USD fail resulting from the oxidation of the buried-type gate, thereby improving yield of the semiconductor device. Also, a sufficient distance between the buried-type gate of the cell region and a gate of a peripheral region can be ensured.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor memory device, the method comprising:
   providing a substrate having a cell region, a peripheral region, and a guard ring region provided between the cell region and the peripheral region;
   etching a second active region in the guard ring region to form a recess in the substrate;
   filling a conductive material into the recess; and
   depositing an insulating film within the recess over the conductive material to form a barrier gate in the second active region of the guard ring region,
   wherein the barrier gate has a guard ring structure surrounding the cell region, and
   wherein the cell region has a first active region and a first device isolation structure, the peripheral region has a second device isolation structure, and the guard ring region has the second active region between the first device isolation structure and the second device isolation structure.

2. The method according to claim 1, wherein the conductive material includes any selected from the group consisting of tungsten, a titanium nitride film and a combination thereof.

3. The method according to claim 1, wherein the insulating film includes a nitride film,
   wherein the insulating film is deposited over the peripheral region and the guard ring region while the insulating film is being deposited within the recess, and
   wherein the method further comprises:
   removing a portion of the insulating film overlying the peripheral region with a mask that exposes only the peripheral region.

4. The method according to claim 1, wherein the barrier gate is formed when a cell gate in the cell region is formed.

5. The method according to claim 1, wherein the guard ring region encloses perimeters of the cell region.

6. The method according to claim 1, wherein the substrate in the cell region is etched to form a recess in the cell region when the substrate in the guard ring region is etched, and
   wherein the recess in the cell region is filled with the conductive material to form a cell gate when the recess in the guard ring region is filled with the conductive material to form the barrier gate.

* * * * *